(12) United States Patent
Buck

(10) Patent No.: US 6,805,569 B2
(45) Date of Patent: Oct. 19, 2004

(54) UNIT CONSISTING OF A PROXIMITY SWITCH AND A CABLE TERMINAL PART AND A PROCESS FOR ITS MANUFACTURE

(75) Inventor: Robert Buck, Wasserburg (DE)

(73) Assignee: i f m electronic GmbH, Essen (DE)

( * ) Notice: Subject to any disclaimer, the term of this patent is extended or adjusted under 35 U.S.C. 154(b) by 0 days.

(21) Appl. No.: 10/437,918

(22) Filed: May 15, 2003

(65) Prior Publication Data

US 2003/0196318 A1 Oct. 23, 2003

Related U.S. Application Data

(62) Division of application No. 09/770,228, filed on Jan. 29, 2001, now Pat. No. 6,614,335.

(30) Foreign Application Priority Data

Jan. 28, 2000 (DE) .......................................... 100 03 775

(51) Int. Cl.[7] .............................................. H01R 13/62
(52) U.S. Cl. ...................................... 439/310; 439/312
(58) Field of Search .................................. 439/308–313, 439/318, 320, 321, 152, 180, 830

(56) References Cited

U.S. PATENT DOCUMENTS

3,491,317 A 1/1970 Harris, Jr.
5,110,305 A 5/1992 Edgley et al.

FOREIGN PATENT DOCUMENTS

| DE | 42 25 267 C2 | 9/1993 |
| DE | 44 19 023 C2 | 12/1995 |
| DE | 195 28 678 C1 | 1/1997 |
| DE | 195 29 181 C2 | 2/1997 |

*Primary Examiner*—Lincoln Donovan
(74) *Attorney, Agent, or Firm*—Nixon Peabody LLP; David S. Safran

(57) ABSTRACT

An electrical unit including a proximity switch and a cable terminal part the proximity switch has an outside housing and an insulation part, the insulation part being on the end face of the outside housing and the insulation part having a terminal element with terminals which lead to the outside. The terminals of the terminal element lead to the outside are made as terminal sockets, the cable terminal part has a cable and a connecting part, the cable being attached in the connecting part, the connecting part being attached to the insulation part and the ends of the wires of the cable are connected in an electrically conductive manner to the terminal sockets of the terminal element.

8 Claims, 3 Drawing Sheets

UNIT CONSISTING OF A PROXIMITY SWITCH AND A CABLE TERMINAL PART AND A PROCESS FOR ITS MANUFACTURE

BACKGROUND OF THE INVENTION

1. Field of the Invention

The present invention relates to a unit consisting of a proximity switch and a cable terminal part and a process for its manufacture.

2. Description of the Related Art

The related art discloses different possibilities for joints or terminals of cables which are detachable and undetachable from a proximity switch. Plug connections, therefore, cable joints, which are made using plug connectors which are connected to the terminals of proximity switches, are known from German [patents] Patent Document DE 195 28 678 and German Patent Document DE 44 10 023. Another detachable cable joint, specifically a screw-type terminal, is known from German Patent Document DE 195 29 181. Relating to nondetachable cable terminals on proximity switches, reference is made by way of example to German Patent Document DE 42 25 267 in which a housing termination consisting of hot-melt cement is described, through which the cables which are connected directly to the electronics in the proximity switch are routed out of the proximity switch.

Both the detachable joints of cables on proximity switches which are known from the related art as well as the nondetachable cable terminals for proximity switches which are known from the related art have a series of defects. The detachable joints generally require a relatively large amount of space. Since recently, however, the trend has been to use smaller and smaller proximity switches, only little space is available for one such detachable joint. In designs with plug connectors it is moreover disadvantageous that they are much more expensive to manufacture than proximity switches to which the cables are directly connected.

In the last two decades, especially in inductive proximity switches, it has been possible to further increase the operating distance at the same outside diameter of the coil used for the inductive proximity switch. This means that at a uniform operating distance of the outside diameter of the proximity switch which is essentially dictated by the coil diameter is reduced. This is advantageous to the user, but entails problems in connection mainly in smaller devices, which are made, for example, in thread sizes M 6 to M 12, i.e., cable or plug terminal technology, since the maximum plug diameter in cylindrical proximity switches generally will not be greater than the threaded or smooth sleeve diameter of the proximity switch in order to enable any installation in walls of different thickness.

In proximity switches with a nondetachable cable joint, either the cable is permanently connected to the electronics and the entire unit after adjustment is inserted into the housing of the proximity switch and potted, or the electronics in the housing of the proximity switch is connected via flexible wires to the cable or plug. And only after final testing are the cables and plugs connected undetachably and mechanically permanently to the housing, for example by potting. These types of direct connection enable the shortest overall lengths, due to the long wires however a large amount of space is necessary.

Since the users of proximity switches for one type of a proximity switch at a time ask for cable colors, cable materials and cable sizes which are different from one another, the diversity of types of proximity switches provided with cables is very great; this leads to the fact that the warehousing costs for storage of all conceivable types of proximity switches are considerable.

SUMMARY OF THE INVENTION

Proceeding from the above explained related art, the object of the present invention is to devise a technically and economically especially favorable unit consisting of a proximity switch and a cable terminal part and a corresponding process for its manufacture.

The unit consisting of a proximity switch and a cable terminal part in which the aforementioned object is achieved is characterized in that the proximity switch has an outside housing and an insulation part, the insulation part is provided on the end face of the outside housing and has a terminal element with terminals which leads to the outside, the terminals of the terminal element which lead to the outside are made as terminal sockets, the cable terminal part has a cable and a connecting part, the cable is attached in the connecting part, and the connecting part is attached to the insulation part and the ends of the wires of the cables are connected in an electrically conductive manner to the terminal sockets of the terminal element.

With the unit in accordance with the present invention including a proximity switch and a cable terminal part, the result is that the proximity switch can be completely finished, can be checked based on the electrical terminals which are present in the form of the terminal sockets, and can then be stored. Connection with the cable required by the user takes place then using the cable terminal part which consists essentially of connecting part which fits the proximity switch and the cable which is wanted by the user and which is attached in it. The proximity switch and the cable terminal part can be quickly joined together, easily and reliably.

Basically, a host of dimensions and forms are possible for the outside housing and the insulation part of the proximity switch and for the cable terminal part.

According to one preferred development of the present invention, it is provided that the maximum diameter of the cable terminal part is less than or equal to the maximum diameter of the insulation part and the maximum diameter of the insulation part is less than or equal to the maximum inside diameter of the outside housing. If the maximum diameters of the cable terminal part, the insulation part and the outside housing are chosen as indicated, the proximity switch can be inserted as far as desired into the hole which is provided for its attachment. Preferably, it is provided for attachment of the proximity switch in the hole that the proximity switch has an outside thread with which it can be screwed into the inside thread which is provided in the hole.

In order to preclude pin confusion or polarity reversal when the proximity switch is joined to the cable terminal part, according to one preferred embodiment of the invention it is provided that the insulation part and the cable terminal part each have codes which correspond to one another and which indicate for the joining of the proximity switch and cable terminal part, the correct alignment of the cable terminal part to the insulation part. Therefore, the alignment of the two components to one another in which the desired contact-making of the wires of the cable which has been attached in the connecting part of the cable terminal part with the terminal sockets of the proximity switch is achieved. Alternatively or additionally, it is preferably provided that the insulation part and the cable terminal part each have a form such that they can be joined exclusively in the correct alignment of the cable terminal part to the insulation part. Before final attachment of the cable terminal part to the insulation part in the manufacture of the unit in accordance with the present invention, twisting of these two components to one another is therefore no longer possible, which further reduces possible problems in connection.

Different techniques are possible for connecting or attaching the ends of the wires of the cable to the terminal sockets of the terminal element. For example, the terminal sockets can be slotted or can be made at least partially elastic so that the stripped ends of the wires of the cable which are then preferably tin-coated and/or bear at least partially conductive sleeves into which the terminal sockets can be inserted. And as a result of the spring action of the terminal sockets, the terminal sockets can be held easily and securely in the sleeves and have good contact to the sleeves. According to one preferred embodiment of the invention, it is alternatively provided that the terminal sockets are designed to accommodate connecting means. Preferably, solder or conductive cement, especially conductive silver cement, is used as the connecting means. The stripped ends of the wires of the cable then project into the terminal sockets, are preferably likewise tin-coated and/or provided at least partially with conductive sleeves and are soldered or cemented in the terminal sockets.

To attach the insulation part in the outside housing likewise different techniques can be used. According to one preferred embodiment of the invention, it is provided that the insulation part is attached in the outside housing by impressing the housing. To attach the insulation part in the outside housing then techniques are used which are described, for example, in the German utility model 299 01 548. To ensure reliable sealing of the proximity switch, it is provided preferably in addition or alternatively that between the insulation part and the housing there is a seal, preferably an elastomer O-ring.

If the insulation part is made of an insulating material, the terminal element can be made very simply, specifically, special insulation is not necessary for the terminal element. In particular, it is preferable to make the insulation part in plastic. The outside housing can also consist of different materials, especially metal or plastic. If the outside housing is likewise made in plastic, the insulation part can be inserted securely into the outside housing, forming a seal, by means of ultrasonic welding.

If the insulation part is made transparent according to one preferred development of the invention, in the proximity switch there can be a display-LED which is visible through a viewing hole in the outside housing and which is useful to the user for recognizing the operating states of the proximity switch.

One especially simple connection when the cable terminal part is joined to the proximity switch is achieved when in the connecting part there is an alignment aid for alignment of the ends of the wires of the cable. Using one such alignment aid, the cables are arranged such that they correspond to the terminal sockets in the insulation part in terms of position. One such alignment aid is preferably made by there being holes into which the ends of the wires of the cable are inserted in the lengthwise direction of the connecting part.

The cable terminal part can be attached to the proximity switch in different ways. According to one preferred development of the invention it is provided that the cable terminal part is connected to the outside housing by impressing the housing. Alternatively or additionally, the cable terminal part can be cemented to the insulation part. If the cable terminal part and the insulation part are made of plastic, the two components can also be joined to one another also by means of ultrasonic welding.

Joining of the proximity switch to the cable terminal part is facilitated according to one preferred development of the invention by the insulation part or the outside housing forming a guide in the radially outer area for the cable terminal part. In doing so, the length of the guide can be dimensioned such that in the manufacture of the unit when the proximity switch and the cable terminal part are joined the cable terminal part comes into contact with the guide before the ends of the wires of the cable reach the terminal sockets. Thus, distortion and along with this possible faulty contact-making of the ends of the cable wires are reliably prevented.

The process in accordance with the present invention for producing a unit consisting of a proximity switch which has an outside housing and an insulation part and of a cable terminal part which has a connecting part and a cable and with which the aforementioned object is achieved is characterized by the following steps, the indicated sequence not being mandatory: connecting the outside housing and the insulation part; providing the insulation part with a terminal element which runs through, its terminals which lead to the outside are made as terminal sockets, attachment of the cable in the connecting part; attaching the cable terminal part to the insulation part and electrically conductive connecting the ends of the wires of the cable to the terminal sockets of the terminal element.

The advantages which are achieved with the process in accordance with the present invention have already been addressed above. In the described manner, the connection of the proximity switch with the cables required by the user is facilitated, and it is not necessary to warehouse a large number of all possible combination types of proximity switches with the cables attached to them.

Preferred developments of the process in accordance with the present invention result from the above described preferred developments of the in accordance with the present invention consisting of a proximity switch and a cable terminal part. In addition, the process in accordance with the present finds one preferred embodiment in that the stripped ends of the wires of the cable are attached by induction soldering in the terminal sockets which have a solder connecting means. This induction heating of the terminal sockets and thus of the solder provided in them is achieved by a coil around the transition of the cable terminal part to the insulation part, only the terminals sockets and the stripped ends of the wires of the cable being heated by the coil in the current-carrying state. In this preferred embodiment of the in accordance with the present invention it can furthermore be provided that the stripped ends of the conductors of the cable are tin-coated and/or are provided at least partially with conductive sleeves before they are inserted into the terminal sockets. In this way, reliable and secure contact-making is ensured.

In particular there are a host of embodiments and possible embodiments of the invention. In this regard, reference is made to the following description of preferred embodiments of the invention with reference to the drawings.

DETAILED DESCRIPTION OF THE PREFERRED EMBODIMENTS

Figure 1:
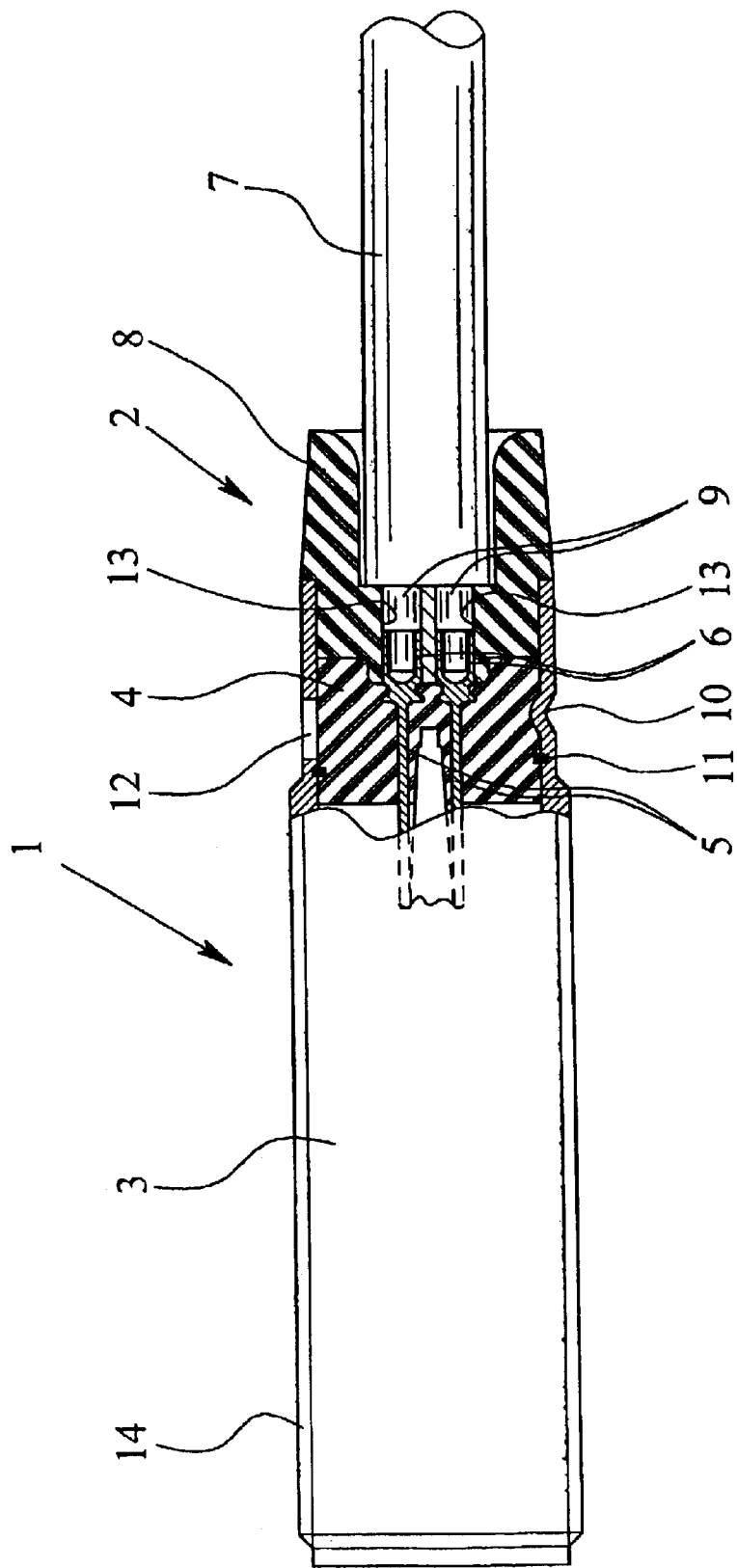
FIG. 1 shows a proximity switch connected with a cable terminal part according to the first embodiment of the invention.

FIG. 1 shows a unit consisting of a proximity switch 1 and a cable terminal part 2, therefore, a proximity switch 1 in the connected state. The proximity switch 1 has an outside housing 3 with one end face closed by the outside housing 3 itself, and an insulation part 4 on the the end face. The isolation part 4 is securely inserted sealed into the outside housing 3. A terminal element 5 which is connected to electronics (not further shown) in the proximity switch 1 runs through the insulation part 4. The externally routed terminals of the terminal element 5 are made as terminal sockets 6. Joined to the proximity switch 1 is the cable terminal part 2 which has a cable 7 and a connecting part 8. The cable 7 is of the type and form which the user, i.e., the orderer of the proximity switch 1, desires and has ordered according to his special requirements for the proximity switch 1. The ends of the wires 9 of the cable 7 are stripped and tin-coated, inserted into the terminal sockets 6, and are connected electrically conductively to the terminal sockets by soldering.

In the production of the unit shown in FIG. 1 according to one preferred embodiment of the invention, first of all, the proximity switch 1 itself is completely finished, afterwards tested and then stored. If there is an order of a user for a proximity switch 1 with a certain type of cable, a corresponding cable terminal part 2 which consists of the desired cable 7 and the connecting part 8 and which can either be connected beforehand or is fabricated only after the order of the user, is joined to the insulation part 4 of the proximity switch 1. Both the insulation part 4 and the connecting part 8 are made of plastic so that a solid connection of these two components to one another by ultrasonic welding can be achieved. The electrically conductive connection between the stripped and tin-coated ends of the wires 9 of the cable 7 to the terminal sockets 6 of the terminal element 5 is achieved by the fact that in the joined state of the proximity switch 1 to the cable terminal part 2 a coil is pushed over the transition between the insulation part 4 and the connecting part 8 so that in its current-carrying state the terminal sockets 6 are heated with the solder provided in them and with the stripped and tin-coated ends of the wires 9 of the cable 7, i.e., the ends inserted in them, by which a good, durable connection is achieved.

As is apparent from FIG. 1, the insulation part 4 is attached in the metallic outside housing 3 by impressing 10 the housing. In order to achieve reliable sealing of the proximity switch 1, between the insulation part 4 and the outside housing 3 there is a seal 11, specifically an elastomer O-ring.

The insulation part 4 is made of transparent plastic so that the current operating state of the proximity switch 1, which is displayed by a display-LED (not further shown), can be recognized by the user of the proximity switch 1 through the viewing hole 12 in the outside housing 3.

In order to facilitate the joining of the cable terminal part 2 to the proximity switch 1 and to prevent problems in doing so as a result of misorientation of these two components to one another or distortions of the ends of the wires 9 of the cable 7, according to the preferred embodiment of the invention shown in FIG. 1, there are special measures. In particular, in the connecting part 8 in its longitudinal direction, holes 13 are formed through which the ends of the wires 9 of the cable 7 are inserted. In this way the correct alignment of the ends of the wires 9 to the terminal sockets 6 of the terminal element 5 is ensured. So that when the proximity switch 1 and the cable terminal part 2 are joined no distortions of the ends of the wires 9 which project via the holes 13 in the connecting part 8 occur, the insulation part 4 is made such that it forms a guide for the cable terminal part 5 in its radially outer area. The length of the guide is dimensioned such that in the production of the unit according to the preferred embodiment of the invention, i.e., when the proximity switch 1 is joined to the cable terminal part 2, the cable terminal part 2 comes into contact with the guide before the ends of the wires 9 of the cable 7 reach the terminal sockets 6 of the terminal element 5.

Finally, even if not apparent in the preferred embodiment of the invention shown in FIG. 1, both on the insulation part 4 and also on the connecting part 8 there is coding which indicates the correct alignment of the two components to one another, i.e. that alignment in which the individual wires 9 of the cable 7 are inserted into the terminal sockets 6 provided for them. In addition, the insulation part 4 and accordingly the connecting part 8 each have a form which allow joining of these two components only in one single direction. In this way, polarity reversal is reliably precluded when the proximity switch 1 is joined to the cable terminal part 2.

The proximity switch 1 has an outside thread 14 with which it is screwed into the corresponding holes which are provided with an inside thread and can be held in them. Since, as is apparent from FIG. 1, the maximum diameter of the proximity switch 1 is determined by the outside thread 14 of the outside housing 3, and the maximum outside diameter of the insulation part 4 and the maximum outside diameter of the cable terminal part 2 are each less than the outside diameter of the proximity switch 2, then the unit consisting of the proximity switch 1 and the cable terminal part 2 can be screwed completely into the corresponding hole.

Figure 2:
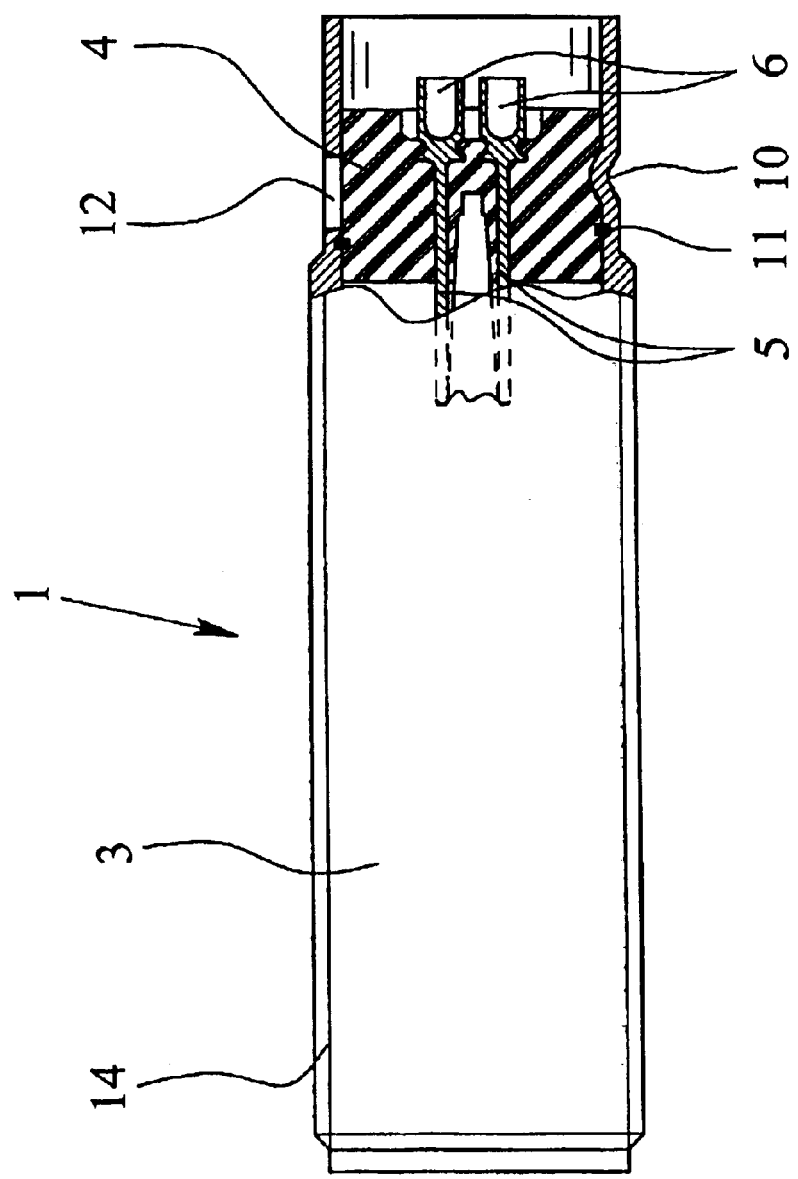
FIG. 2 shows a prefabricated unconnected proximity switch according to the embodiment of the invention as shown in FIG. 1.

FIG. 2 shows the proximity switch 1 according to the preferred embodiment of the invention as shown in FIG. 1 in the unconnected state, therefore, without the connected cable terminal part 2. In this form, the proximity switch 1 is completed, tested and afterwards warehoused.

Figure 3:
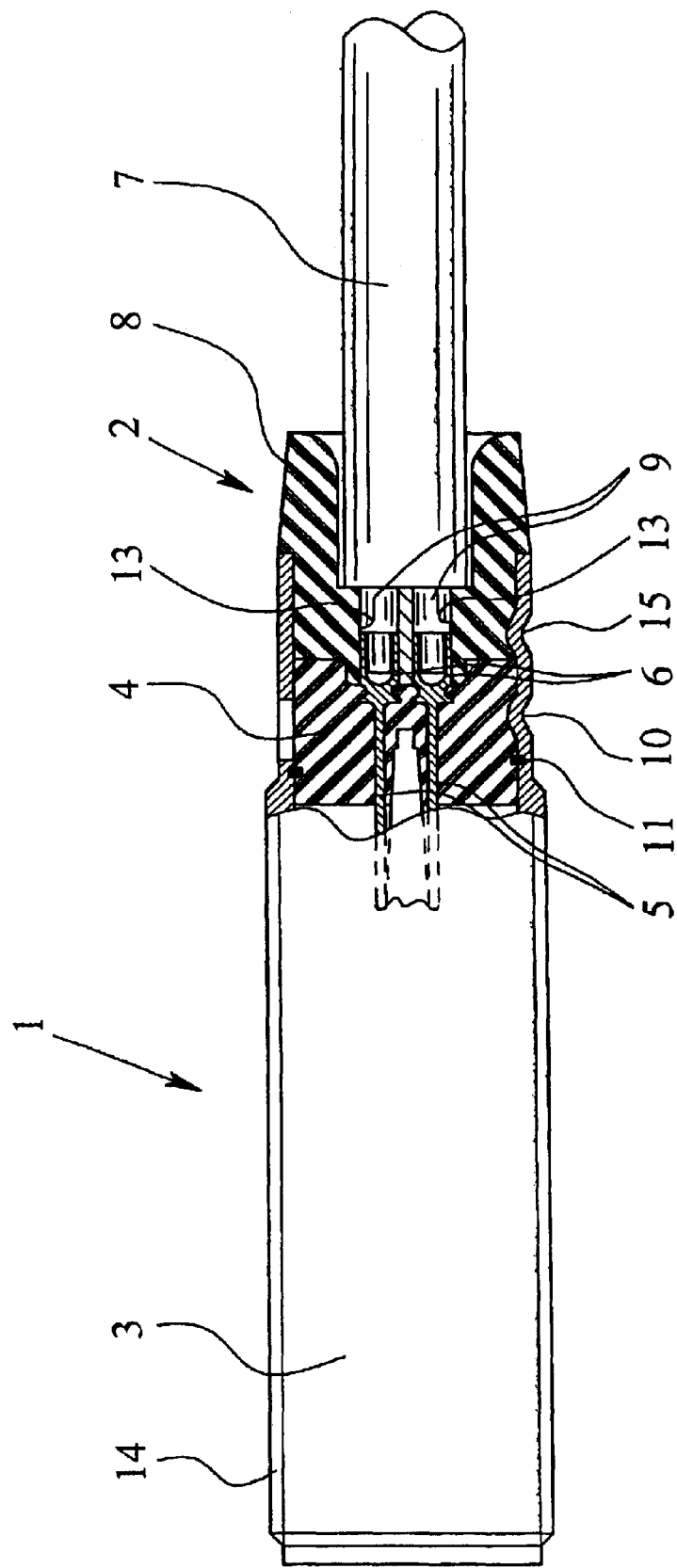
FIG. 3 shows a proximity switch connected with the cable terminal part according to the second embodiment of the invention.

A unit consisting of a proximity switch 1 and a cable terminal part 2 according to a second embodiment of the invention is shown in FIG. 3. The important difference of the unit shown in FIG. 3 from to the unit shown in FIG. 1 is that the attachment of the cable terminal part 2 to the proximity switch 1 by impressing on the outside housing 3 has taken place. The outside housing 3 of the proximity switch 1 is made such that it surrounds the connecting part of the cable terminal part 2 radially at a length such that the impressing 15 on the outside housing 3 leads to a form fit to the connecting part 8 of the cable terminal part 2. Attachment by impressing 15 can be accomplished alternatively or additionally to the ultrasonic welding provided according to the first preferred embodiment of the invention between the insulation part 4 and the connecting part 8.

What is claimed is:

1. A process for producing a unit including a proximity switch which has an outside housing and an insulation part, and a cable terminal part which has a cable including a pair of wires and a connecting part, said process comprising the steps of:

connecting the outside housing and the insulation part;
   providing the insulation part with a terminal element having terminal sockets that extend longitudinally therefrom;
   attaching the cable to the connecting part;
   attaching the cable terminal part to the insulation part; and
   connecting the ends of the wires of the cable to the terminal sockets of the terminal element by an electrically conductive connection.

2. The process as claimed in claim 1, wherein the wires have stripped ends, said stripped ends of the wires being attached by induction soldering in terminal sockets of the connection element.

3. The process as claimed in claim 2, wherein the outside housing and the insulation part are composed of plastic.

4. The process as claimed in claim 3, wherein and the insulation part is inserted to the outside housing and joined by ultrasonic welding to form a seal.

5. The process as claimed in claim 4, wherein the cable terminal part is connected to the outside housing by impressing the outside housing.

6. The process as claimed in claim 5, wherein the connecting part and the insulation part are made of plastic and the connecting part is connected to the insulation part by ultrasonic welding.

7. The process as claimed in claim 6, wherein the connecting part is cemented to the insulation part.

8. The process as claimed in claim 7, wherein when the cable terminal part is connected to the insulation part, and the cable terminal part is guided by way of a guide formed by one of the insulation part and the outside housing in a radially outer area.

* * * * *